(12) United States Patent
So

(10) Patent No.: US 7,777,857 B2
(45) Date of Patent: Aug. 17, 2010

(54) SUBSTRATE OF DISPLAY DEVICE FOR PACKAGING DRIVING INTEGRATED CIRCUIT

(75) Inventor: Chang-Sob So, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 443 days.

(21) Appl. No.: 11/288,387

(22) Filed: Nov. 29, 2005

(65) Prior Publication Data

US 2006/0221290 A1 Oct. 5, 2006

(30) Foreign Application Priority Data

Mar. 29, 2005 (KR) ...................... 10-2005-0026176

(51) Int. Cl.
G02F 1/1345 (2006.01)

(52) U.S. Cl. ....................... 349/152; 349/149; 349/150; 349/151

(58) Field of Classification Search ......... 349/149–152; 710/2, 3, 5, 20, 36, 48, 52, 58; 361/278, 361/292.2, 298.4, 306.1, 309; 257/150–151; 326/41, 47, 101; 439/407.14
See application file for complete search history.

(56) References Cited

U.S. PATENT DOCUMENTS

| | | | |
|---|---|---|---|
| 5,349,226 A | | 9/1994 | Kawaguchi |
| 6,297,868 B1 * | 10/2001 | Takenaka et al. | 349/151 |
| 6,396,558 B1 * | 5/2002 | Kim et al. | 349/152 |
| 6,697,040 B2 * | 2/2004 | Imajo et al. | 345/98 |
| 2003/0058205 A1 * | 3/2003 | Yarita et al. | 345/87 |
| 2005/0052442 A1 * | 3/2005 | Takenaka et al. | 345/204 |
| 2005/0195356 A1 * | 9/2005 | Aruga et al. | 349/149 |

FOREIGN PATENT DOCUMENTS

| | | |
|---|---|---|
| JP | 2000-081635 | 3/2000 |
| JP | 2001-265244 | 9/2001 |
| JP | 2001-306040 | 11/2001 |
| JP | 2003-098973 | 4/2003 |
| JP | 2004-070137 | 3/2004 |

* cited by examiner

*Primary Examiner*—Hoan C Nguyen
(74) *Attorney, Agent, or Firm*—Morgan Lewis & Bockius LLP

(57) ABSTRACT

A substrate of a display device for packaging a driving integrated circuit (IC) including an input lead and an output lead includes an input pad group corresponding to the input lead on the substrate along a first direction, an output pad group corresponding to the output lead on the substrate along a second direction transverse to the first direction, an extra input pad group adjacent to the input pad group along the first direction, and an extra output pad group adjacent to the output pad group along the second direction.

9 Claims, 5 Drawing Sheets

SUBSTRATE OF DISPLAY DEVICE FOR PACKAGING DRIVING INTEGRATED CIRCUIT

The present invention claims the benefit of Korean Patent Application No. 2005-26176, filed in Korea on Mar. 29, 2005, which is hereby incorporated by reference.

BACKGROUND OF THE INVENTION

1. Field of Invention

The present invention relates to a substrate of a display device, and more particularly, to a substrate of a display device for packaging a driving integrated circuit (IC).

2. Description of Related Art

With the progression of the information age, flat panel display (FPD) devices having light weight, thin profile, and low power consumption characteristics are being developed and commonly used as substitutes for cathode ray tube (CRT) devices. Generally, display devices are classified as emissive display devices and non-emissive display devices according to their light emitting capabilities. The emissive display devices display images by taking advantage of their ability to emit light while the non-emissive display devices require a light source because they cannot emit light by themselves. For example, plasma display panel (PDP) devices, field emission display (FED) devices, and electroluminescent display (ELD) devices are common examples of emissive display devices. Liquid crystal display (LCD) devices, on the other hand, are categorized as non-emissive display devices. Even though LCD devices are non-emissive display devices, they are commonly used in notebook and desktop computers because of their high resolution, high quality color-displaying capabilities.

An LCD module of the LCD device includes an LCD panel for displaying images, a backlight unit for supplying light to the LCD panel, and a driving unit for driving the LCD panel. The driving unit is generally positioned along a periphery of the LCD panel. The LCD panel includes two substrates facing and spaced apart from each other with a liquid crystal material interposed therebetween. A plurality of matrix-type pixels connected to a plurality of thin film transistors that supply signals to the pixels are formed on one of the two substrates.

The driving unit includes a printed circuit board (PCB) on which a plurality of elements generating various control signals and data signals are packaged. A driving integrated circuit (IC) connected to the PCB on the LCD panel applies signals to the signal lines of the LCD panel through the PCB. The LCD panels are generally manufactured using three types of techniques: (1) chip-on-glass (COG), (2) tape carrier package, and (3) chip-on-film. In particular, the COG type LCD panels commonly include the driving ICs directly packaged on the substrate of the LCD panel.

FIG. 1 is a schematic plan view showing a substrate of a display device having pads for packaging a driving IC according to the related art. FIG. 2 is a schematic plan view showing a driving IC having lead patterns that connect to the substrate of FIG. 1 according to the related art.

As shown in FIG. 1, an input pad (IP) group and an output pad (OP) group are formed on a substrate 10 and are arranged within a packaging area of a driving IC 20 (illustrated as a dotted region). Specifically, the input pad group IP includes a plurality of input pads 22, and the output pad group OP includes a plurality of output pads 24. Gate lines GL formed in a display region (not shown) are connected to the output pad group OP. FIG. 2 illustrates a driving IC 20 including a set of input leads (IL) and a set of output leads (OL) to be packaged on the substrate 10.

FIG. 1 illustrates an exemplary arrangement structure of the input pad group IP and the output pad group OP on a COG type LCD panel corresponding to the input leads IL and the output leads OL of the driving IC 20. Because of varying designs used by driving IC manufacturers, the arrangement of the input pad group IP and the output pad group OP formed on the substrate 10 may or may not match the arrangement of the input leads IL and the output leads OL of the driving IC 20. Therefore, when the output leads OL of the driving IC 20 have a zigzag pattern, the pads 22 and 24 of the input pad group IP and the output pad group OP, respectively, may not properly correspond to the input and output lead patterns IL and OL of the driving IC 20. As a result, utility and reliability of the substrate 10 coupled with the driving IC 20 are reduced, leading to an increase in fabrication processes and production costs in order to manufacture new substrates to match new driving ICs having new lead patterns.

SUMMARY OF THE INVENTION

Accordingly, the present invention is directed to a substrate of a display device for packaging a driving integrated circuit (IC) that substantially obviate one or more of the problems due to limitations and disadvantages of the related art.

An object of the present invention is to provide a substrate of a display device for packaging a driving IC that does not have to be customized for different driving ICs.

Another object of the present invention is to provide a substrate of a chip on glass (COG) type display device for packaging a driving IC that does not have to be customized for different driving ICs.

Yet another object of the present invention is to provide a substrate of a display device for packaging a driving IC that adapts to a range of different driving ICs.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a substrate of a display device for packaging a driving integrated circuit including an input lead and an output lead includes an input pad group corresponding to the input lead on the substrate along a first direction, an output pad group corresponding to the output lead on the substrate along a second direction transverse to the first direction, an extra input pad group adjacent to the input pad group along the first direction, and an extra output pad group adjacent to the output pad group along the second direction.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the illustrated embodiments of the present invention, examples of which are illustrated in the accompanying drawings. Wherever possible, the same reference numbers will be used throughout the drawings to refer to the same or the like parts.

Figure 1:
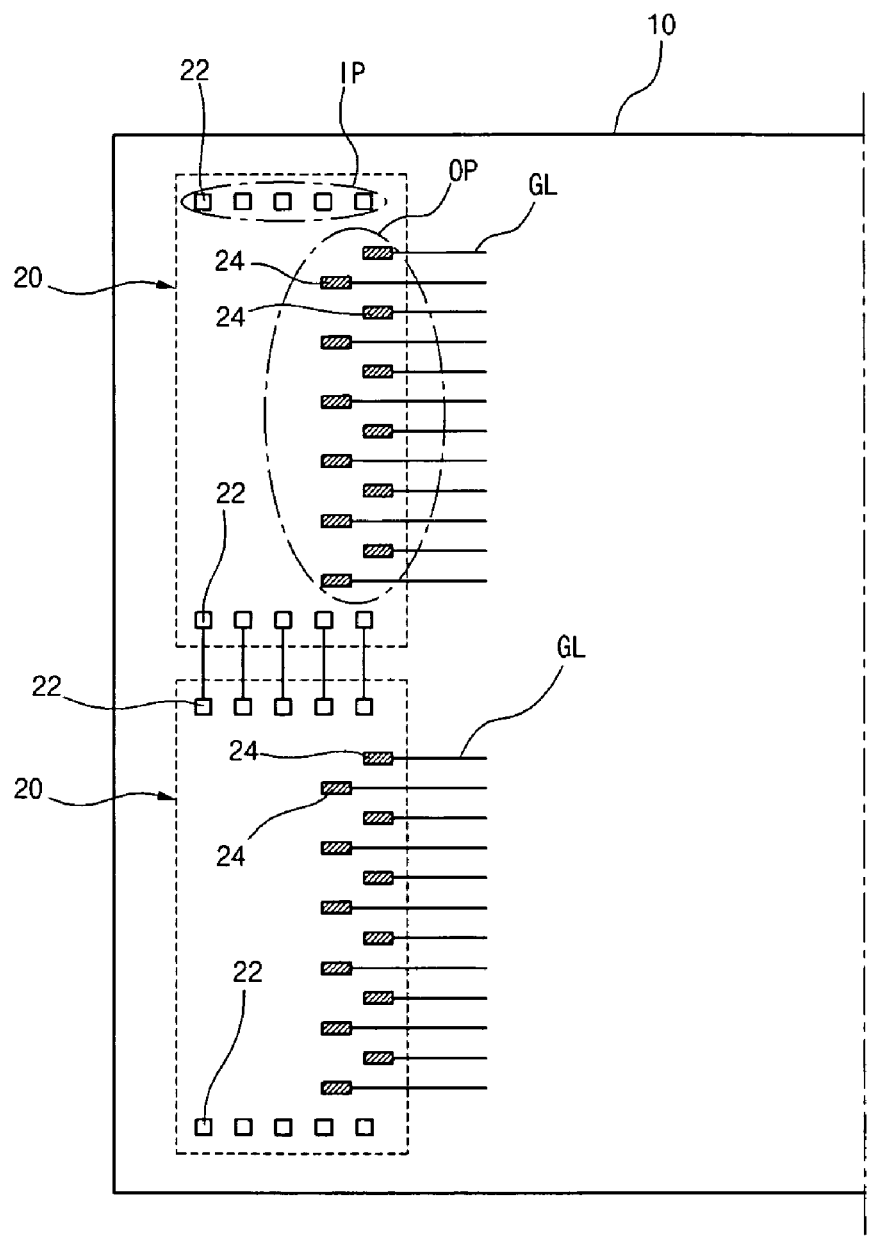
FIG. 1 is a schematic plan view of a substrate of a display device having pads for packaging a driving IC according to the related art.
Figure 2:
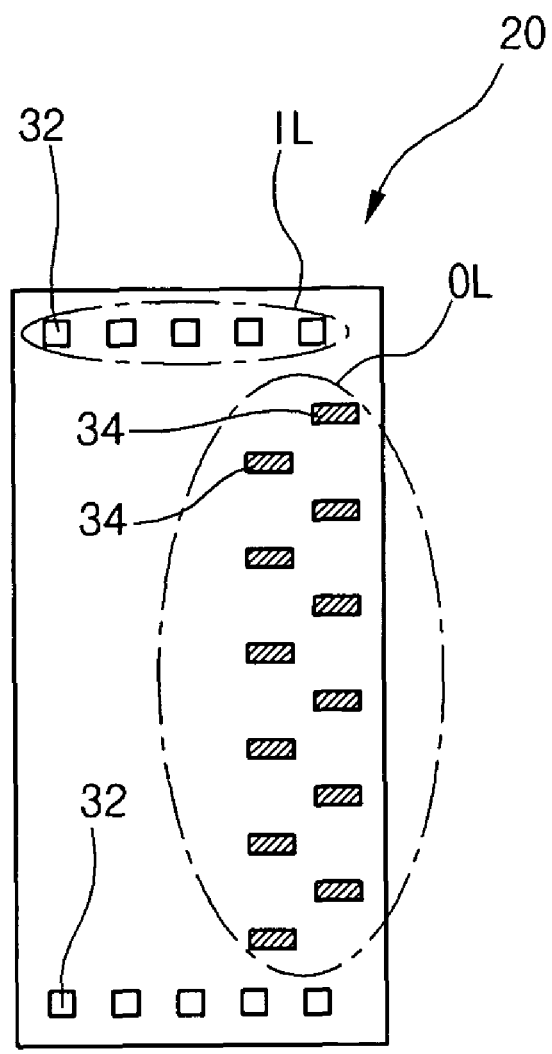
FIG. 2 is a schematic plan view of a driving IC having lead patterns applied to the substrate of FIG. 1 according to the related art.
Figure 3:
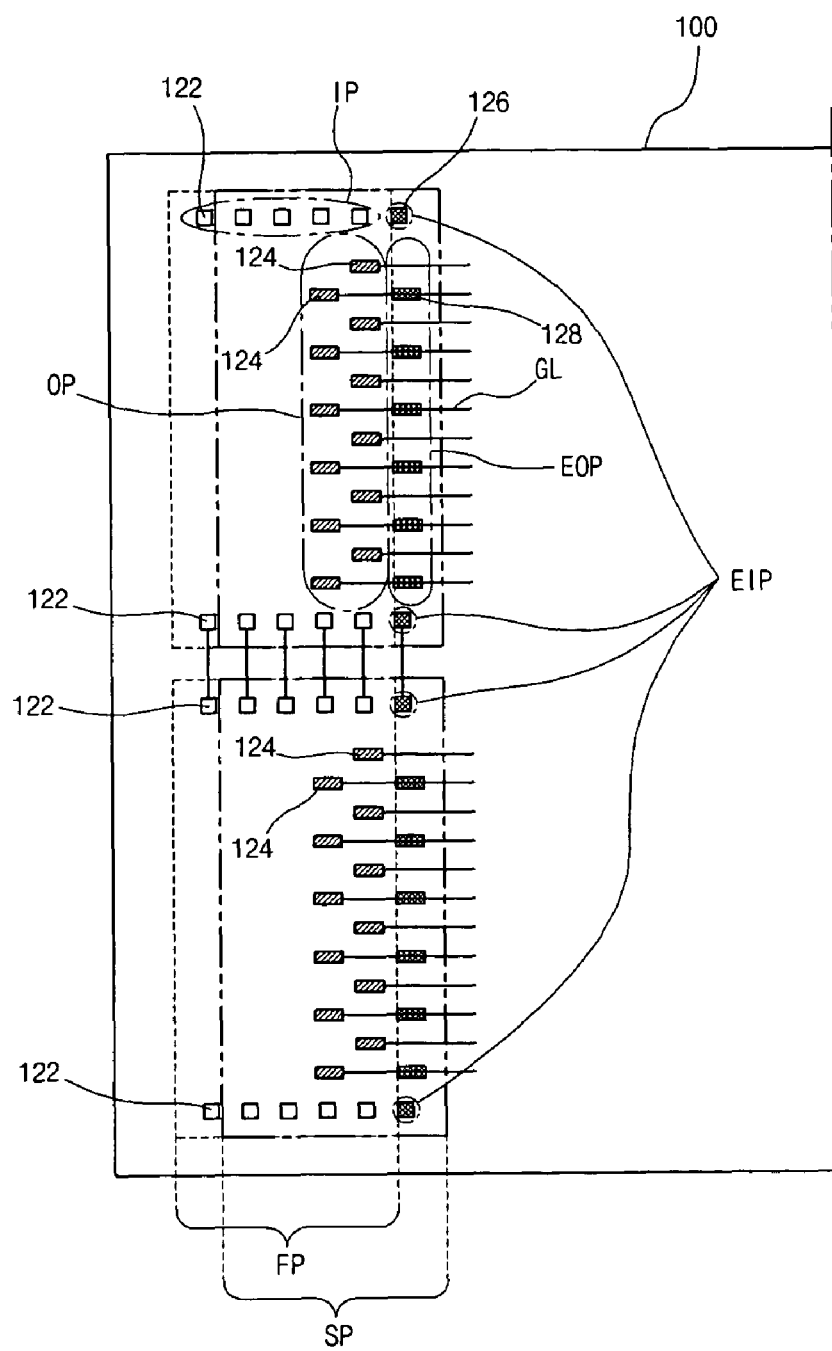
FIG. 3 is a schematic plan view of a substrate for a display device having pads for packaging a driving IC according to an exemplary embodiment of the present invention.
Figure 4A:
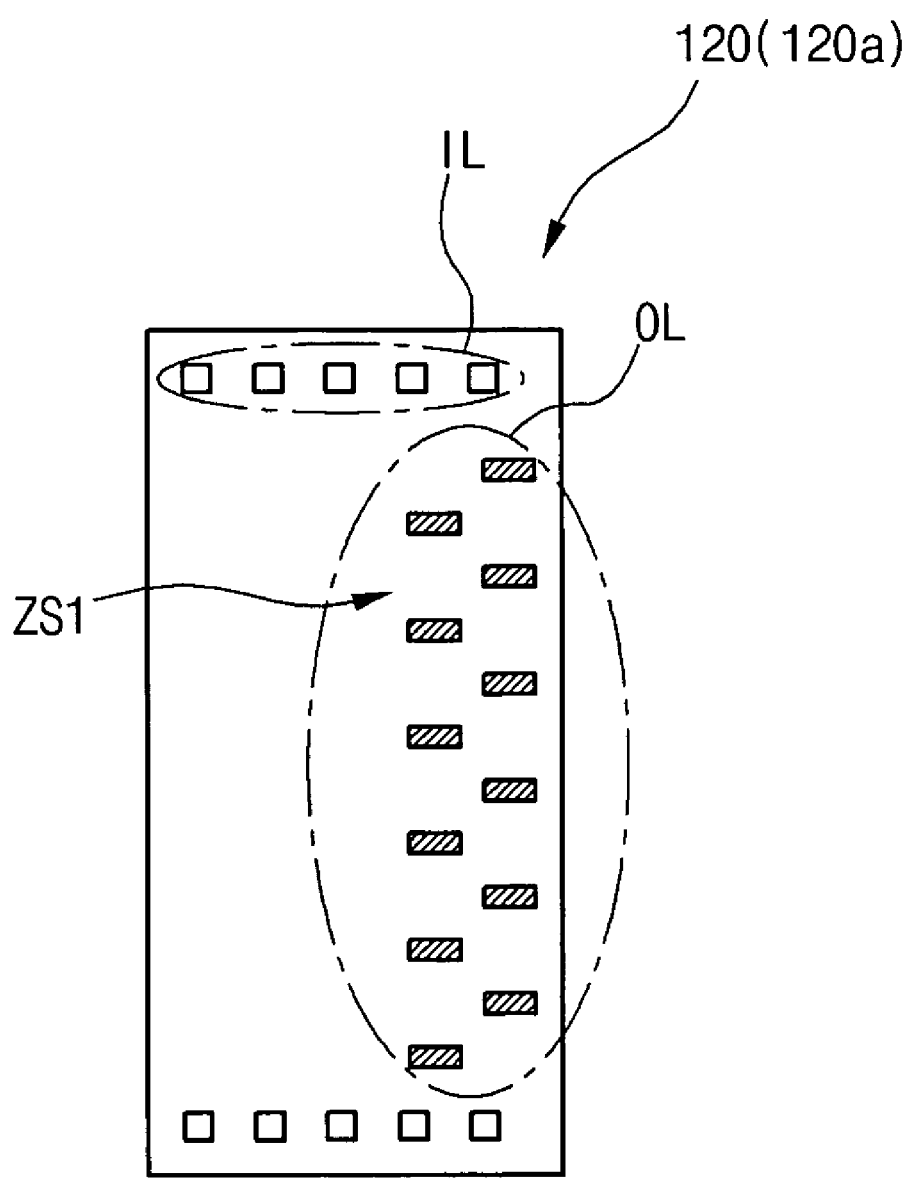
FIGS. 4A and 4B are schematic plan views of driving ICs having exemplary lead patterns applied to the substrate of FIG. 3 according to the present invention.
Figure 4B:
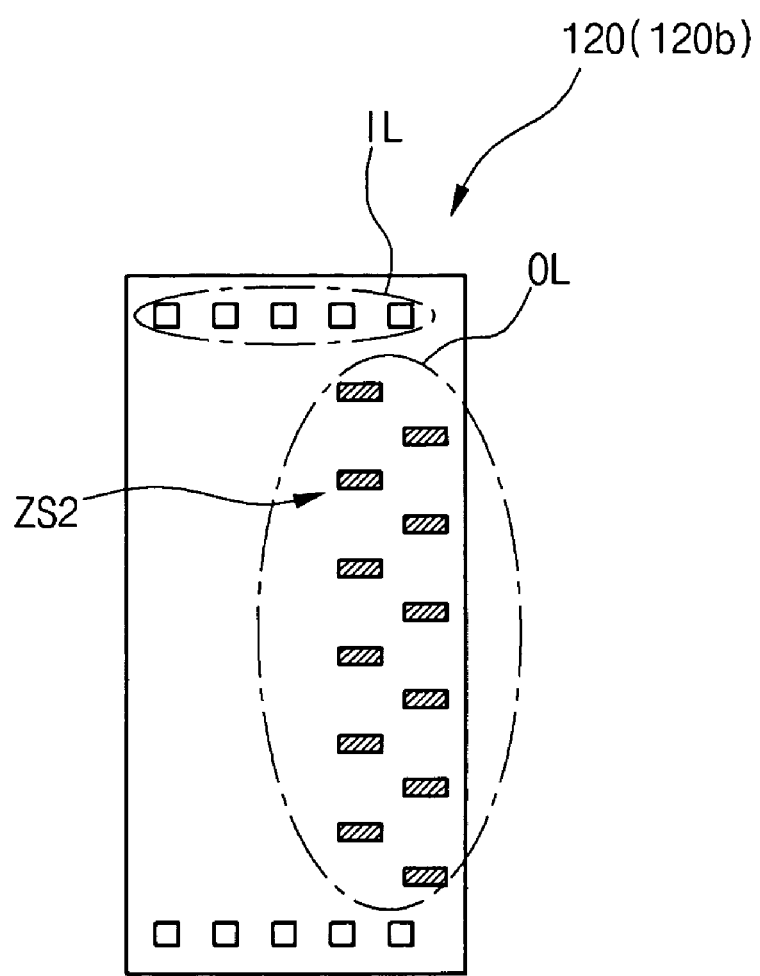

FIG. 3 is a schematic plan view of a substrate for a display device having pads for packaging a driving IC according to an exemplary embodiment of the present invention. FIGS. 4A and 4B are schematic plan views of driving ICs having exemplary lead patterns applied to the substrate of FIG. 3 according to the present invention.

As shown in FIG. 3 in conjunction with FIGS. 4A and 4B, an input pad group IP corresponding to an input lead IL of a driving IC 120 is disposed on a substrate 100 along a first direction. An output pad group OP corresponding to an output lead OL of the driving IC 120 is disposed on the substrate 100 along a second direction generally transverse to the first direction. The input pad group IP includes a plurality of input pads 122 and the output pad group OP includes a plurality of output pads 124. Each of the output pads 124 is connected to a gate line GL formed in a display region (not shown).

In addition to the input and output pad groups IP and OP, an extra input pad group EIP is adjacent to the input pad group IP along the first direction and an extra output pad group EOP is adjacent to the output pad group OP along the second direction. The extra input pad group EIP includes a plurality of extra input pads 126 and the extra output pad group EOP includes a plurality of extra output pads 128. In the present exemplary embodiment, the plurality of input pads 122 and the plurality of output pads 124 are disposed on a straight line, respectively. However, other arrangements may be used.

In general, the plurality of extra input pads 126 and the plurality of extra output pads 128 are arranged along the outer periphery of the input pad group IP and output pad group OP. For example, the output pads 124 in the output pad group OP generally form a zigzag pattern as shown in FIG. 3. Furthermore, the extra output pads 128 are disposed along the periphery of the output pad group OP such that the extra output pads 128 and the output pads 124 adjacent to the extra output pads 128 generally form a mirrored zigzag pattern. In addition, each of the plurality of extra output pads 128 is electrically connected to a corresponding one of the output pads 124 by a corresponding gate line GL. Due to the mirrored zigzag pattern formed by the extra output pad group OP, driving ICs 120 having converse zigzag shapes (as shown in FIGS. 4A and 4B, for example) can be packaged on the substrate 100 according to the exemplary embodiment of the present invention, thereby increasing the number of different driving ICs that can be packaged on the substrate 100.

For example, a first driving IC 120a having a first zigzag shape ZS1 as illustrated in FIG. 4A is packaged on the substrate 100 in a first position FP (FIG. 3). Moreover, a second driving IC 120b having a second zigzag shape ZS2 as illustrated in FIG. 4B that is converse to the first zigzag shape ZS1 of FIG. 4A can be packaged on the substrate 100 in a second position SP by using the extra output pad group EOP (FIG. 3). The extra input pads 126 in the extra input pad group EIP electrically connects the driving ICs when placed in the second position SP.

In the exemplary embodiment described above, the substrate 100 may be made of a glass. However, different material substrates may be used without departing from the spirit of the invention.

As explained above, the exemplary substrate 100 of a display device for packaging a driving IC 120 of the present invention including extra input/output pad groups EIP/EOP provides an advantage over the related art by adapting to various types of driving ICs having output leads with differing zigzag patterns. Thus, the exemplary substrate 100 of the present invention increases product competitiveness by minimizing manufacturing time and reducing waste of pre-fabricated substrates when driving ICs having new lead patterns no longer fit on the pre-fabricated substrates.

It will be apparent to those skilled in the art that various modifications and variations can be made in the liquid crystal display devices of the present invention without departing from the spirit or scope of the invention. Thus, it is intended that the present invention covers the modifications and variations of this invention provided they come within the scope of the appended claims and their equivalents.

What is claimed is:

1. A substrate of a display device for packaging a driving integrated circuit (IC) including input leads and output leads, comprising:
    an input pad group corresponding to the input lead on the substrate along a first direction;
    an output pad group corresponding to the output lead on the substrate along a second direction transverse to the first direction, the output pad group including a plurality of output pads;
    an extra input pad group adjacent to the input pad group along the first direction; and
    an extra output pad group adjacent to the output pad group along the second direction, the extra output pad group including a plurality of extra output pads,
    wherein the plurality of output pads are disposed in a first zigzag pattern and the plurality of extra output pads and the plurality of output pads adjacent to the plurality of extra output pads form a second zigzag pattern having a mirror image of the first zigzag pattern, and
    wherein the second zigzag pattern includes a part of the plurality of output pads of the first zigzag pattern.

2. The substrate according to claim 1, wherein the input pad group includes a plurality of input pads and the extra input pad group includes a plurality of extra input pads.

3. The substrate according to claim 2, wherein each of the plurality of output pads is connected to a corresponding gate line.

4. The substrate according to claim 3, wherein the plurality of input pads are disposed in a straight line.

5. The substrate according to claim 4, wherein the plurality of extra input pads and the plurality of extra output pads are aligned along the second direction, and wherein the plurality of extra output pads are spaced apart from and disposed along the periphery of the plurality of output pads.

6. The substrate according to claim 5, wherein each of the plurality of extra output pads is electrically connected to a corresponding one of the plurality of output pads via the corresponding gate line.

7. The substrate according to claim 1, wherein the substrate is made of a glass.

8. The substrate according to claim 7, wherein the display device includes a chip-on-glass (COG) type display device.

9. The substrate according to claim 1, wherein the output leads of the driving integrated circuit (IC) have a first zigzag shape or a second zigzag being converse to the first zigzag shape.

* * * * *